United States Patent [19]

Iyengar

[11] Patent Number: 5,748,556
[45] Date of Patent: May 5, 1998

[54] TRISTATABLE DRIVER FOR INTERNAL DATA BUS LINES

[75] Inventor: Narasimhan Iyengar, Plano, Tex.

[73] Assignee: SGS-Thomson Microelectronics, Inc., Carrollton, Tex.

[21] Appl. No.: 777,836

[22] Filed: Dec. 31, 1996

Related U.S. Application Data

[63] Continuation of Ser. No. 809,392, Dec. 17, 1991, abandoned.

[51] Int. Cl.$^6$ .................................................. G11C 8/00
[52] U.S. Cl. ........................... 365/230.06; 365/189.11; 365/208
[58] Field of Search ................. 365/230.06, 189.11, 365/207, 208, 189.01, 190, 203; 307/530

[56] References Cited

U.S. PATENT DOCUMENTS

| | | | |
|---|---|---|---|
| 3,953,839 | 4/1976 | Dennison | 365/188 |
| 4,077,031 | 2/1978 | Kitagawa et al. | 365/205 |
| 4,739,198 | 4/1988 | Maruyama | 307/530 |
| 4,757,215 | 7/1988 | Seo | 365/203 |
| 4,797,573 | 1/1989 | Ishimoto | 365/189.11 |
| 4,843,595 | 6/1989 | Suzuki | 307/530 |
| 4,845,681 | 7/1989 | Vu | 307/530 |
| 4,910,714 | 3/1990 | Hurtgring | 365/189.11 |
| 5,068,831 | 11/1991 | Hoshi | 365/208 |

OTHER PUBLICATIONS

Kayano, et al, 25–ns 256K X1/64KX4 CROS SRAM's, *IEEE Journal of Solid–State Circuits*, vol. SC–21, No. 5, Oct. 1986, pp. 686–691.

*Primary Examiner*—A. Zarabian
*Attorney, Agent, or Firm*—David V. Carlson; Theodore E. Galanthay; Lisa K. Jorgenson

[57] ABSTRACT

An integrated circuit, such as a memory, having an internal data bus for communicating the output of a sense amplifier, is disclosed. The sense amplifiers are of the differential type, having first and second sense nodes at which the amplified differential signal appears. When unselected, or during precharge, each sense amplifier is precharged so that its sense nodes are at a power supply voltage, for example $V_{cc}$. Each sense amplifier is connected to a data driver of the push-pull type, in such a manner that both the pull-up and pull-down transistors are off in the precharged or unselected state. This ability to tristate the data driver from the precharged state of the sense amplifier allows for the high impedance state to be entered without requiring an additional signal to be communicated thereto. Such operations as precharging the data bus conductors are thus facilitated, providing improved access time performance.

25 Claims, 4 Drawing Sheets

TRISTATABLE DRIVER FOR INTERNAL DATA BUS LINES

CROSS-REFERENCE TO RELATED APPLICATION

This application is a file-wrapper-continuation of U.S. patent application Ser. No. 07/809,392, filed Dec. 17, 1991, now abandoned.

This application is related to application Ser. No. 809,735, filed contemporaneously herewith, and assigned to SGS-Thomson Microelectronics, Inc.

This invention is in the field of integrated circuits, and is more particularly directed to data communication internal to memory circuits.

BACKGROUND OF THE INVENTION

Many integrated circuits communicate multiple bits of digital data in parallel at various times in their operation by way of an internal data bus, consisting of a set of parallel conductors to which multiple circuit functions are connected. In particular, memory circuits often include a data bus to facilitate access from memory cells at various locations within the chip. For example, an internal data bus is particularly useful in memories organized into sub-arrays, or blocks of memory cells, where access of a selected memory cell does not require enabling of the entire memory device. The resulting power savings makes such partitioned memory arrays especially useful in low power memories for portable computers.

As is generally the case in bus-based architectures, the situation of bus contention, where multiple drivers are attempting to drive opposite data states on the same bus line, must be avoided. This is generally accomplished by providing tristatable drivers for the buses, where each driver that is not to be driving the bus places its output into a high impedance state, thus allowing another driver to control the bus.

In the system context, it is quite simple to implement tristate drivers into the driving circuits by way of providing additional control signals, such as output enables and chip enables. However, the implementation of tristate data drivers internal to an integrated circuit, particularly a memory circuit, is relatively difficult due to the limited space within the circuit. For example, implementation of an additional enable signal into the sense amplifiers of a memory circuit requires the communication of an additional signal line throughout the chip, as well as additional transistors within the sense amplifier for receiving and responding to the signal, plus driver circuitry for the enable signal.

Other conventional techniques for isolating the sense amplifiers from an internal data bus is by way of a series pass gate, controlled by a control signal so that each sense amplifier is connected to or isolated from the internal data bus as appropriate. The inclusion of a series pass gate between the sense amplifiers and the internal data bus adds propagation delay in the critical path for a read operation, however, and as such this technique is not optimal.

It is therefore an object of the invention to provide a tristatable data driver which enters a high impedance state by detecting a precharged state of the sense amplifier.

It is a further object of the invention to provide such a data driver which does not require an additional control signal.

It is a further object of the invention to provide such a data driver with minimal propagation delay.

Other objects and advantages of the present invention will become apparent to those of ordinary skill in the art having reference to the following specification together with the drawings.

SUMMARY OF THE INVENTION

The invention may be implemented in an integrated circuit, such as a memory, particularly into data drivers connected to sense amplifiers which drive common data bus lines. The data driver is of the push-pull type, and includes inverters therein which couple the complementary sense nodes to the push-pull gates. When the sense amplifier is turned off, or otherwise disabled, the gates of the push-pull devices each receive the level which turns the transistors off, thus placing the output in a high impedance state.

DETAILED DESCRIPTION OF THE PREFERRED EMBODIMENT

Figure 1:
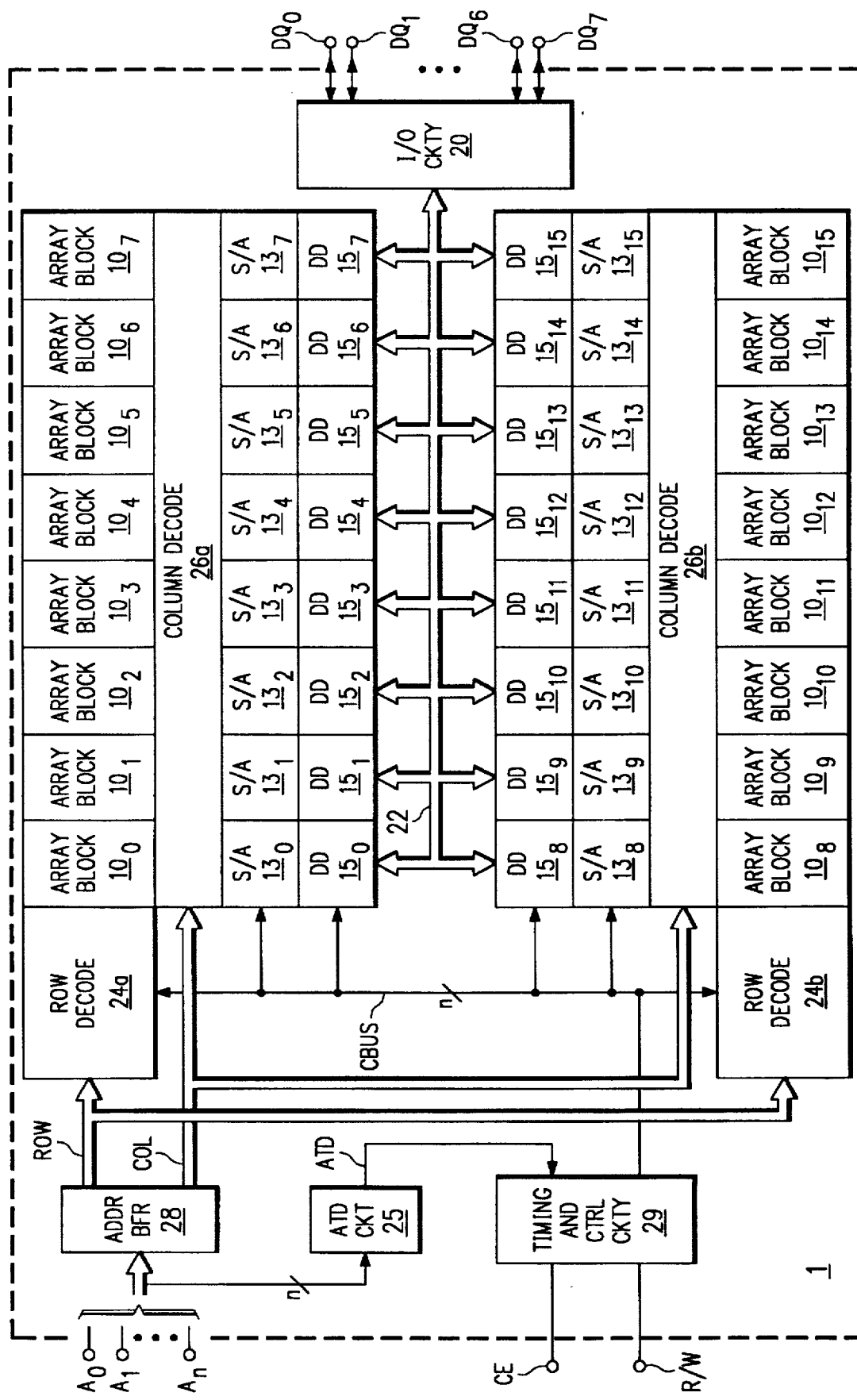
FIG. 1 is an electrical diagram, in block form, illustrating the architecture of a memory integrated circuit into which the preferred embodiment of the invention may be incorporated.

Referring now to FIG. 1, an example of an integrated circuit into which the preferred embodiment of the invention is implemented will be described. In this example, memory 1 is a static random access memory (SRAM) of otherwise conventional architecture, having its memory cells in multiple blocks 10 which are shown, in FIG. 1, according to an example of their physical location in such a memory. It is contemplated that integrated circuits of other types which utilize long data conductors may also benefit from the present invention, such integrated circuits including microprocessors, logic devices, and other types of memories including read-only memories, FIFOs, DRAMs and the like.

As is conventional, memory cells in memory 1 are arranged in rows and columns, and are selected according to an address signal received at address terminals $A_0$ through $A_n$. Address terminals $A_0$ through $A_n$ are connected to address buffers 28, which buffer the received address signal and communicate a portion of the address signal to row decoders 24a, 24b on bus ROW, and communicate the remainder to column decoders 26a, 26b on bus COL. Row decoders 24a, 24b select a row of memory cells by enabling the selected word line, in the conventional manner, and are thus preferably located along a side of the memory array blocks 10. Column decoders 26a, 26b, in this example, select eight memory cells in the selected row to be sensed by a sense/write circuit 13 according to the column portion of the address.

In memory 1 according to this example, the memory cells are grouped into sixteen array blocks $10_0$ through $10_{15}$. This partitioning of the memory into sixteen array blocks 10 is particularly beneficial in low power memories, such as may be used in portable computers, as only the block 10 in which the selected memory cells are located need be enabled during a cycle. Selection of the block may be done according to one of the row address bits (indicating upper or lower half) and to four of the column address bits (indicating one of sixteen array blocks 10 to be selected). Further reduction in the active power may be obtained by the implementation of latched row line repeaters between array blocks 10, as described in copending application Ser. No. 588,609, filed Sep. 26, 1990, assigned to SGS-Thomson Microelectronics, Inc., and incorporated herein by this reference.

Memory 1, as in the case of most modern SRAMs and DRAMs, includes some amount of dynamic operation, such as precharging and equilibration of certain nodes (e.g., bit lines) at particular points in the memory cycle. Initiation of the cycle in SRAM 1 occurs by way of address transition detection, performed by address transition detection (ATD) circuit 25. ATD circuit 25 is connected to each of the address inputs $A_0$ through $A_n$, preferably prior to address buffers 28 (as shown), and generates a pulse on line ATD responsive to detecting a transition at any one or more of address inputs $A_0$ through $A_n$, such a pulse useful in controlling the internal operation of memory 1 in the conventional manner, and also in the manner to be described hereinbelow.

Other internal operational functions are controlled by timing and control circuitry 29, which receives the signal on line ATD from ATD circuit 25, and which also receives certain external control signals such as the chip enable signal at terminal CE, and the read/write select signal at terminal R/W. Timing and control circuitry 29 generates various control signals based on these inputs, for control of the various functions within memory 1 in the conventional manner. As shown in FIG. 1, control bus CBUS is connected to sense/write circuit 13 and data drivers 15, by which such signals as the GEQT, GEQC, SAEQ__, SCLK, ISO signals described hereinbelow are generated and communicated within memory 1.

Memory 1 in this example is of the byte-wide type, and as such it has eight input/output terminals $DQ_0$ through $DQ_7$ at which output data is presented during a read operation, and at which input data is received during a write operation. Input/output circuitry 20 is connected between data bus 22 and terminals DQ, and includes conventional input and output buffers connected thereto. A preferred type of output buffer is described in copending application Ser. No. 809,387, filed contemporaneously herewith, assigned to SGS-Thomson Microelectronics, Inc., and incorporated herein by this reference.

Each of array blocks $10_0$ through $10_{15}$ is associated with a corresponding group of sense/write circuits $13_0$ through $13_{15}$, as shown in FIG. 1. In this example, eight individual sense/write circuits 13 are included within each group of sense/write circuits $13_0$ through $13_{15}$, one sense/write circuit 13 for each of the eight bits to be communicated on internal data bus 22 from the selected one of array blocks $10_0$ through $10_{15}$. Groups of data drivers $15_0$ through $15_{15}$ are each associated with a corresponding group of sense/write circuits $13_0$ through $13_{15}$ for receiving the data signal therefrom and for driving internal data bus 22 therewith; individual data drivers 15 are associated with individual sense/write circuits 13 in each group, one data driver 15 for driving each line in data bus 22.

Figure 5:
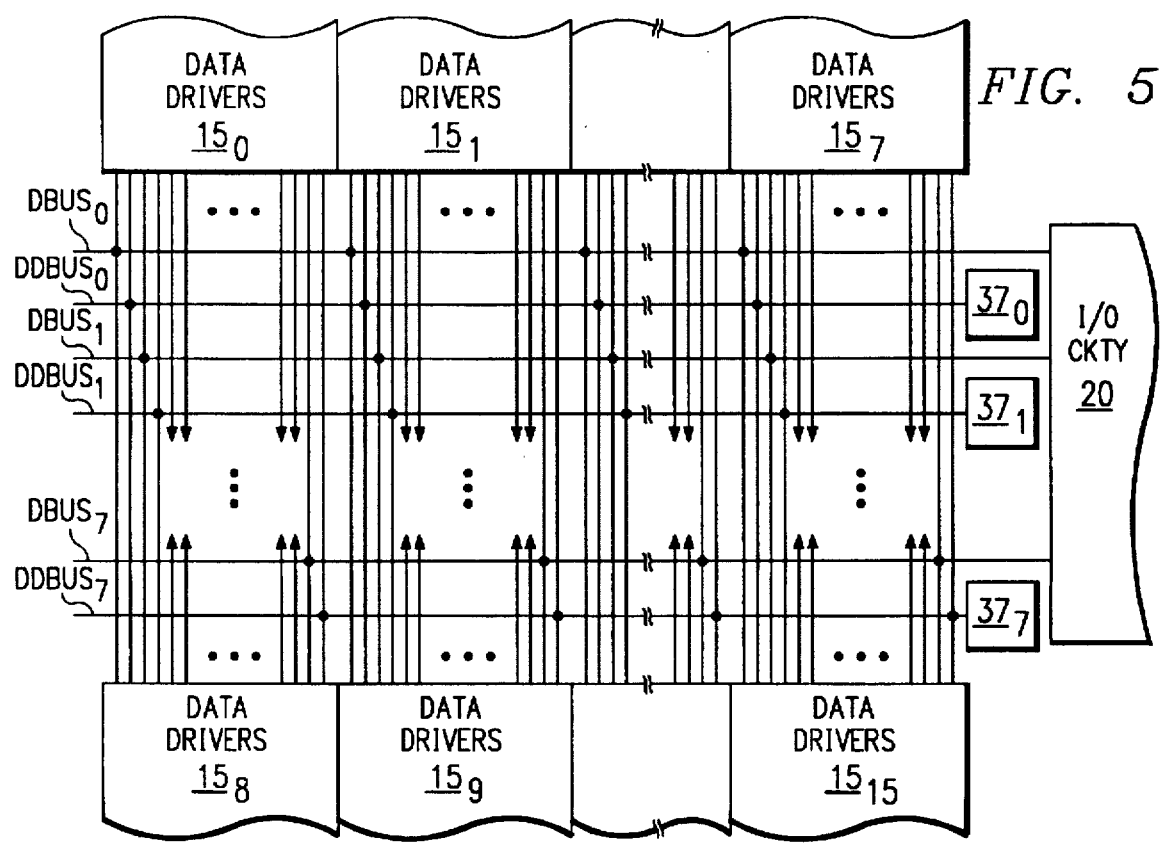
FIG. 5 is an electrical diagram, in block form, illustrating the connection of the data conductors and dummy data conductors to the data driver circuits for each array block.

In this example, the memory array is also divided into halves, with array blocks $10_0$ through $10_7$ in one array half and array blocks $10_8$ through $10_{15}$ in the other half. Internal data bus 22 runs the length of the array halves, and is located therebetween as shown in FIGS. 1 and 5. As shown in FIG. 5, data bus 22 includes data conductors $DBUS_0$ through $DBUS_7$, each associated with an input/output terminal $DQ_0$ through $DQ_7$ (and coupled thereto via input/output circuitry 20). Each individual data conductor $DBUS_k$ is connected to a corresponding data driver 15 in each of the sixteen data driver groups $15_0$ through $15_{15}$ of the sixteen array blocks $10_0$ through $10_{15}$. For a read/write memory such as memory 1, a separate input data bus can be used to communicate input data to be written to the selected memory cells, in the conventional manner. Alternatively, the input data may also be communicated along data bus 22, as is conventional for some memory designs.

Data bus 22 also includes eight dummy data conductors $DDBUS_0$ through $DDBUS_7$, each of which are also connected to a corresponding data driver 15 in each of the sixteen data driver groups $15_0$ through $15_{15}$ of the sixteen array blocks $10_0$ through $10_{15}$. Dummy data conductors $DDBUS_0$ through $DDBUS_7$ are used for precharging of data bus 22, as will be described hereinbelow, and not for communication of a data state; as such, dummy data conductors $DDBUS_0$ through $DDBUS_7$ are not coupled to input/output circuitry 20 for communication of data to and from terminals DQ, but instead are terminated by terminations 37, as shown in FIG. 5. To ensure proper precharge of data conductors DBUS, each of dummy data conductors DDBUS preferably physically resembles one of data conductors DBUS, having substantially the same length and cross-sectional area, and being formed of the same material.

In the arrangement of FIGS. 1 and 5, it is therefore apparent that each of the data conductors DBUS in data bus 22 will be relatively long, running much of the length of the chip in order to connect to data drivers 15 for each of the array blocks 10. As such, the series resistance of each data bus conductor DBUS can be quite high, even when formed of metal such as aluminum, especially in high density circuits. For example, each data bus conductor DBUS can be on the order of 13,200 μ long, with a cross-sectional area of on the order of 1.1 $μ_2$; an aluminum conductor of these dimensions will have a series resistance of on the order of 550 Ω. In addition, with many (e.g., sixteen) data drivers 15 connected to each data bus conductor DBUS, as well as the input/output circuitry 20 connected thereto, the capacitance associated with a single data bus conductor DBUS can be on the order of 4 pF. The R-C load of data bus conductors DBUS can thus be quite significant, requiring on the order of 2.2 nsec to switch from rail-to-rail (5 volts) for typical on-chip drivers, and thus directly and significantly impacts the read access time of the memory. Due to the size of write drivers available in input/output circuitry 20, and also where a separate input data bus is provided, the write time may not be affected to the same degree; in addition, the duration of the write operation is generally not as critical a parameter in a high speed memory as the read access time. As will be described hereinbelow, use of dummy data conductors DDBUS according to the present invention can provide significant reduction in the access time of memory 1.

Figure 2:
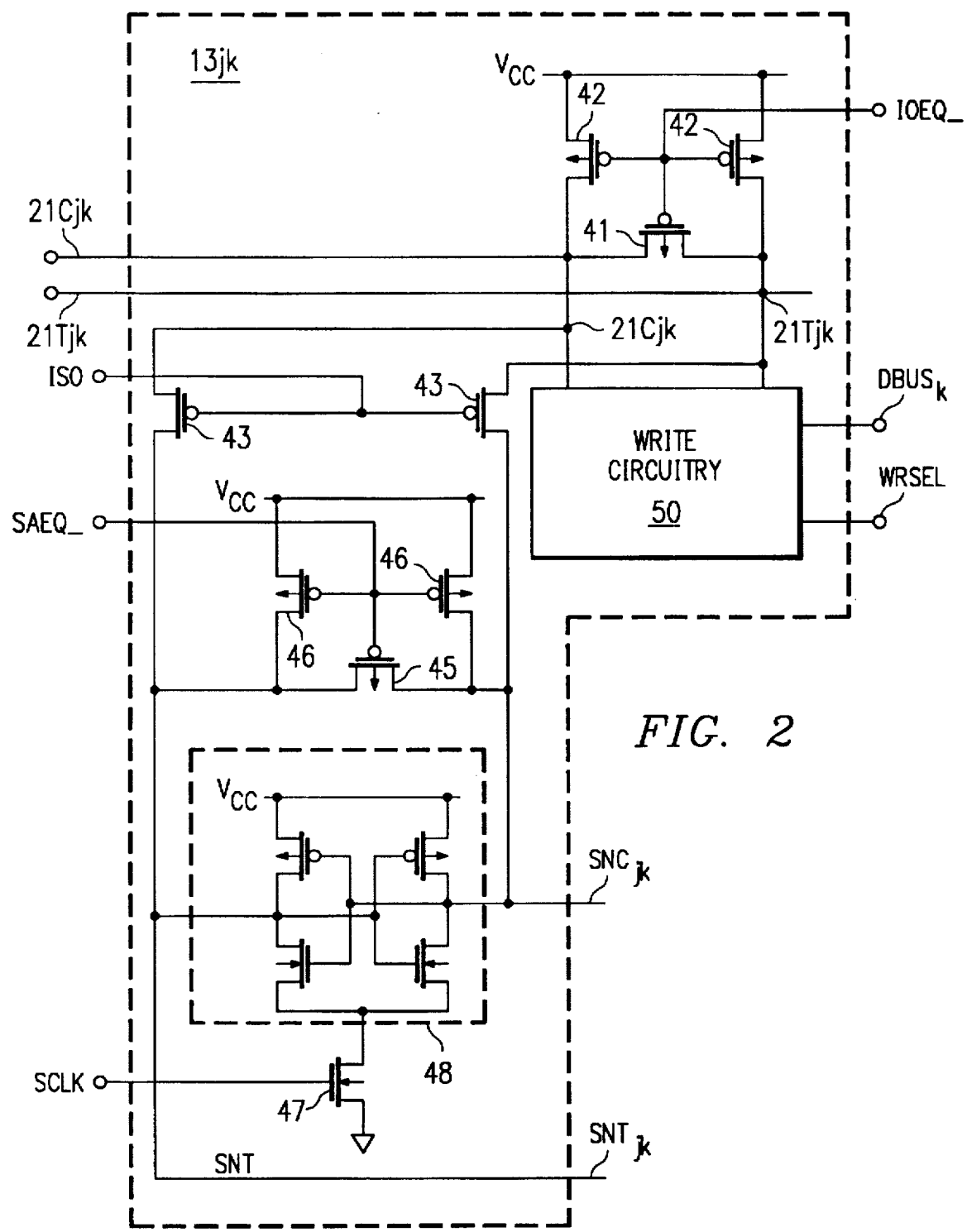
FIG. 2 is an electrical diagram, in schematic form, of one of the sense amplifiers and data drivers in the memory circuit of FIG. 1.

Referring now to FIG. 2, the construction of an example of one of sense/write circuits 13 including sense amplifier 48 will now be described in detail. Further detail concerning this example of sense/write circuits 13, and its operation relative to column decoder 26, is described in copending application Ser. No. 627,049, filed Dec. 13, 1990, assigned to SGS-Thomson Microelectronics, Inc. and incorporated herein by this reference. Sense/write circuit $13_{jk}$ of FIG. 2 is the sense/write circuit associated with array group $10_j$ and input/output terminal $DQ_k$.

Of course, other sense/write circuit designs may alternatively be used in connection with the present invention. One example of such an alternative design is a multiple stage sense amplifier scheme, including a level shifter stage connected to each of the differential bit lines for implementing a DC level shift thereon, followed by a combination of a current mirror and differential sense amplifier (the differential sense amplifier similar as that shown in FIG. 2). Other sense amplifier configurations and implementations may similarly be used, in the alternative to that shown in FIG. 2.

In the example of FIG. 2, complementary input/output lines $21T_{jk}$, $21C_{jk}$ (T for true and C for complement) are coupled, via column decoder 26, to the bit lines of the selected memory cell in array group $10_j$ associated with input/output terminal $DQ_k$; in a read operation, input/output lines $21T_{jk}$, $21C_{jk}$ communicate data from the selected memory cell, and in a write operation input/output lines $21T_{jk}$, $21C_{jk}$ communicate data to the selected memory cell. Input/output lines $21T_{jk}$, $21C_{jk}$ are each connected to the drain of a p-channel precharge transistor 42; the sources of transistors 42 are both connected to the precharge voltage for the input/output lines $21T_{jk}$, $21C_{jk}$, which in this case is $V_{cc}$. Input/output lines $21T_{jk}$, $21C_{jk}$ are also connected to one another by p-channel equilibration transistor 41. The gates of transistors 41 and 42 are connected to line IOEQ_, which is generated by timing control circuitry 22 responsive to an address transition detected by ATD circuit 25, or to such other events during the cycle for which equilibration of input/output lines 21 are desired.

On the read side of sense/write circuit $13_{jk}$, input/output lines $21T_{jk}$, $21C_{jk}$ are each connected to a p-channel pass transistor 43, each of pass transistors 43 having its gate controlled by an isolate signal ISO. Accordingly, input/output lines $21T_{jk}$, $21C_{jk}$ may be isolated from the read circuitry by line ISO at a high logic level, and may be connected thereto by line ISO at a low logic level. The complementary lines on the opposite side of pass transistors 43 from input/output lines $21T_{jk}$ and $21C_{jk}$ are referred to in FIG. 2 as sense nodes $SNT_{jk}$ and $SNC_{jk}$, respectively.

Sense nodes $SNT_{jk}$, $SNC_{jk}$ are also preferably precharged and equilibrated (in this example, to the voltage $V_{cc}$) during the appropriate portion of the cycle, as sense amplifier 48 within sense/write circuit 13 operates in dynamic fashion, as will be described hereinbelow. P-channel precharge transistors 46 each have their source-to-drain paths connected between $V_{cc}$ and sense nodes $SNT_{jk}$ and $SNC_{jk}$, respectively. Equilibration transistor 45 is a p-channel transistor having its source-to-drain path connected between sense nodes $SNT_{jk}$ and $SNC_{jk}$. The gates of transistors 45 and 46 are all controlled by line SAEQ_ which, when at a low level, precharges and equilibrates sense nodes $SNT_{jk}$ and $SNC_{jk}$ in similar manner as input/output lines $21T_{jk}$ and $21C_{jk}$, described above, and as the bit lines in array block $10_j$.

Sense amplifier 48 is a conventional CMOS latch consisting of cross-coupled inverters therewithin; the inputs and outputs of the cross-coupled latches are connected to sense nodes $SNT_{jk}$, $SNC_{jk}$ in the conventional manner. N-channel pull-down transistor 47 has its source-to-drain path connected between the sources of the n-channel transistors in sense amplifier 48 and ground, and has its gate controlled by line SCLK.

Pull-down transistor 47 provides dynamic control of sense amplifier 48, so that the sensing of sense nodes $SNT_{jk}$, $SNC_{jk}$ is performed in dynamic fashion. As is well known in dynamic RAMs, the dynamic sensing in this arrangement is controlled with transistor 47 initially off at the time that pass transistors 43 connect sense nodes $SNT_{jk}$, $SNC_{jk}$ to input/output lines $21T_{jk}$, $21C_{jk}$, respectively; during this portion of the cycle, sense amplifier 48 is presented with a small differential voltage between sense nodes $SNT_{jk}$ and $SNC_{jk}$. After development of this small differential voltage, line SCLK is driven high, so that the sources of the pull-down transistors in sense amplifier 48 are pulled to ground. This causes sense amplifier 48 to develop a large differential signal on sense nodes $SNT_{jk}$ and $SNC_{jk}$, and latch the sensed state thereof.

As will be apparent from the description hereinbelow, each sense/write circuits $13_{jk}$ associated with the same data conductor $DBUS_k$ are coupled to one another in essentially wired-OR fashion. Accordingly, the control signals ISO, SAEQ_, and SCLK which are presented to the read side of sense/write circuit $13_{jk}$ are preferably generated by column decoder 26 in conjunction with timing control circuitry 29. Such generation of these control signals provides that the ones of sense/write circuit $13_{jk}$ associated with unselected array blocks 10 are not enabled (by lines ISO maintained high, and lines SAEQ_ and SCLK maintained low) so as to maintain their sense nodes $SNT_{jk}$ and $SNC_{jk}$ equilibrated and precharged to $V_{cc}$, preventing bus conflict on data bus 22.

On the write side of sense/write circuit $13_{jk}$, write circuitry $50_{jk}$ receives input data from data conductor $DBUS_k$ associated therewith, and a control signal on line WRSEL from timing and control circuitry 29. In write operations, write circuitry $50_{jk}$ presents the data state of data conductor $DBUS_k$ in complementary fashion on input/output lines $21T_{jk}$, $21C_{jk}$ in the conventional fashion. The above-referenced copending application Ser. No. 627,049 describes a preferred example of write circuitry $50_{jk}$ in further detail.

Figure 3:
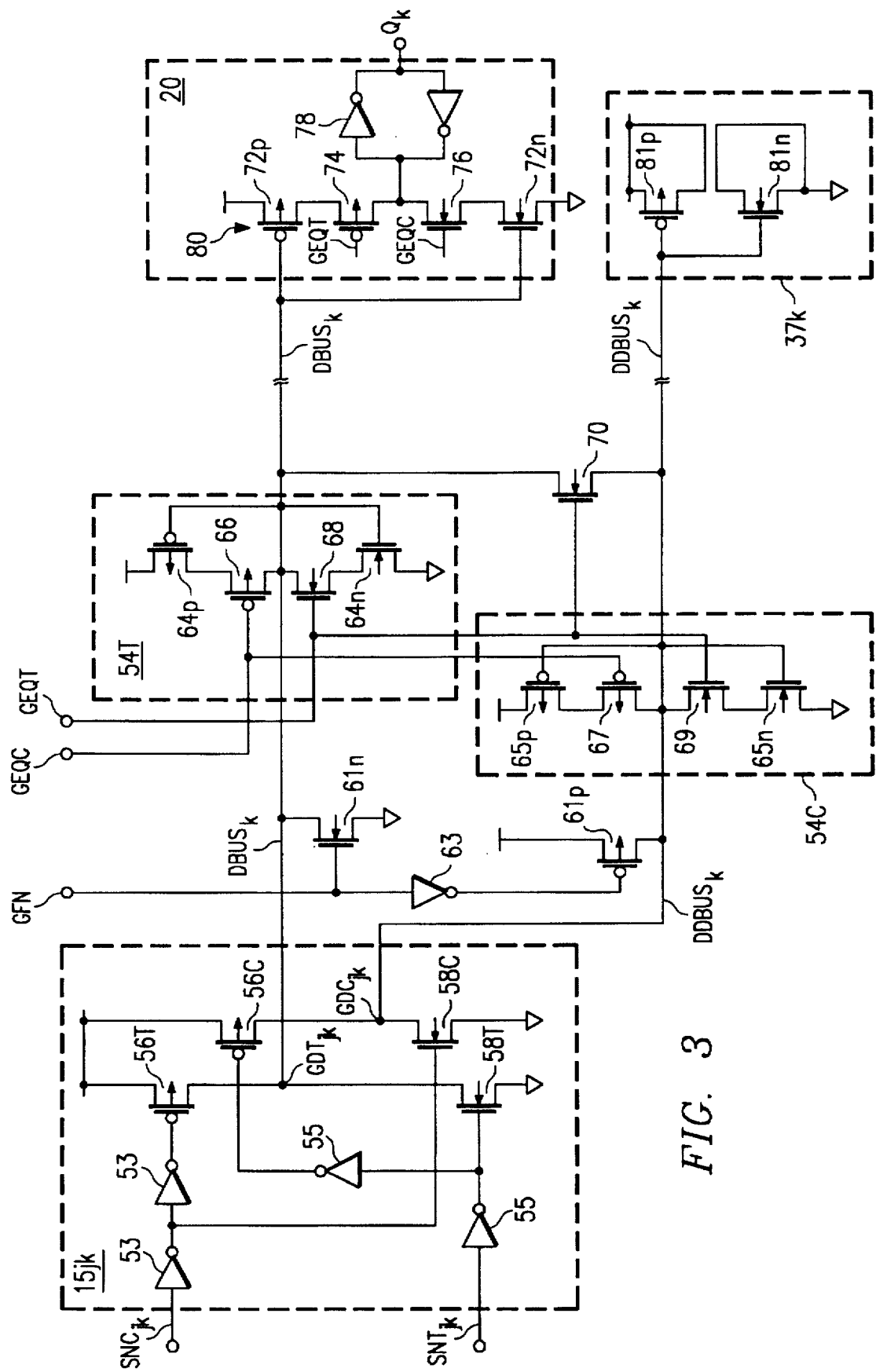
FIG. 3 is an electrical diagram, in schematic form, of the combination of one of the data conductors and its associated dummy data conductor according to the preferred embodiment of the invention.

Referring now to FIG. 3, the construction and operation of one of data drivers 15 according to the preferred embodiment of the invention will now be described in detail. Data driver $15_{jk}$ of FIG. 3 is associated with input/output terminal $DQ_k$ and with array block $10_j$, and accordingly receives, as inputs, nodes $SNT_{jk}$ and $SNC_{jk}$ from sense/write circuit $13_{jk}$ of FIG. 2.

Nodes $SNT_{jk}$ and $SNC_{jk}$ are received at inputs of tristate data driver $15_{jk}$. According to this embodiment of the invention, and as will become apparent hereinbelow, data conductors DBUS and dummy data conductors DDBUS must each be driven by tristate drivers, in order to enable their precharging by way of charge sharing with one another. In addition, since multiple data drivers 15 drive the same data conductors DBUS (and dummy data conductors DDBUS), each of data drivers 15 must have a high-impedance state to avoid bus contention problems. In prior memory configurations, this is generally accomplished by merely turning off the sense amplifiers. However, since sense/write circuits 13 in this example precharge their output nodes SNT, SNC high (as is the case in many memory circuits), this state does not necessarily prevent the active driving of data conductors DBUS.

Other prior schemes, in which sense amplifier outputs are precharged to the same voltage, have included an enable signal for controlling tristate data drivers. In these prior schemes, however, an additional signal line must be provided for each data driver, as well as the necessary circuitry for generating this additional signal and also a relatively complex data driver capable of responding to the additional signal. Still other conventional schemes included a series pass gate between the sense amplifier and the internal data bus, such a pass gate adding its propagation delay time in the critical read path, and thus being undesirable.

Data driver $15_{jk}$ according to the preferred embodiment of the invention provides tristate capability in a simple and effective manner. Driver $15_{jk}$ includes two push-pull driver circuits therein, for driving complementary nodes $GDT_{jk}$ and $GDC_{jk}$, respectively, which in turn are connected to data conductor $DBUS_k$ and dummy data conductor $DDBUS_k$, respectively. These push-pull drivers each include p-channel pull-up transistor 56 and n-channel pull-down transistor 58, having their source/drain paths connected in series between $V_{cc}$ and ground; the output of each of the drivers is, in the conventional sense, at the common drain of transistors 56 and 58. In this example, the drains of transistors 56T, 58T at node $GDT_{jk}$ are connected to data conductor $DBUS_k$, and the drains of transistors 56C, 58C at node $GDC_{jk}$ are connected to dummy data conductor $DDBUS_k$. Referring back to FIGS. 1 and 5, similar nodes GDT, GDC in the other fifteen data drivers 15 are similarly connected to data conductor $DBUS_k$ and dummy data conductor $DDBUS_k$, thus necessitating the ability of drivers 15 to have a high-impedance output state.

Node $SNC_{jk}$ is connected to the gate of pull-up transistor 56T after inversion by two inverters 53, and is connected to the gate of pull-down transistor 58C after inversion by one of inverters 53. Conversely, node $SNT_{jk}$ is connected directly to the gate of pull-up transistor 56C via two inverters 55, and to the gate of pull-down transistor 58T after inversion by one of inverters 55. The connection of two inverters 53, 55 to nodes $SNC_{jk}$ and $SNT_{jk}$, respectively, provides a balanced load to the differential output of sense/write circuit $13_{jk}$.

In operation, when sense/write circuit $13_{jk}$ is on, and senses a logic "one" state in the selected memory cell, node $SNT_{jk}$ will be high and node $SNC_{jk}$ will be low. Accordingly, transistors 58T and 56C will both be off, and transistors 56T and 58C will both be on, driving node $GDT_{jk}$ to a high logic level and driving node $GDC_{jk}$ to a low level. Conversely, when sense/write circuit $13_{jk}$ senses a logic "zero" state, node $SNT_{jk}$ will be low and node $SNC_{jk}$ will be high; this turns on transistors 58T, 56C, turns off transistors 56T, 58C, and thus drives node $GDT_{jk}$ low and node $GDC_{jk}$ high.

As described hereinabove, sense/write circuit $13_{jk}$ is turned off when its array block $10_j$ is not selected (or during a write operation). In this embodiment, sense/write circuit $13_{jk}$ drives both of its nodes $SNT_{jk}$, $SNC_{jk}$ high when disabled, by operation of transistors 45, 46 being turned on and transistors 43 and 47 being turned off (see FIG. 2). A high logic level on node $SNC_{jk}$ turns off transistors 56T, 58C, and a high logic level on node $SNT_{jk}$ turns off transistors 56C, 58T. Accordingly, both pull-up transistors 56 and both pull-down transistors 58 are turned off by sense/write circuit $13_{jk}$ being turned off, placing nodes $GDT_{jk}$ and $GDC_{jk}$ at their output in a high-impedance state. This tristate condition is therefore obtained without requiring the generation and communication of an additional signal, but is accomplished as a response to the precharged condition of sense/write circuit $13_{jk}$. Accordingly, to enable precharge and equilibration of data conductors DBUS and dummy data conductors DDBUS, driver $15_{jk}$ is placed in a high impedance state during precharge and equilibration, as signal SAEQ_ is at a low logic level during this time (placing both nodes $SNT_{jk}$, $SNC_{jk}$ high at that time).

Data bus conductors DDBUS and dummy data bus conductors DDBUS can all biased to known complementary voltages, by way of transistors $61n$, $61p$ and signal GFN. A single placement of transistors $61n$, $61p$ for each data bus conductor $DDBUS_k$ and dummy data bus conductor $DDBUS_k$ may be sufficient, or alternatively multiple placements of transistors $61n$, $61p$ may be used. Data bus conductor $DDBUS_k$ is connected to the drain of n-channel transistor $61n$, which has its source connected to ground and its gate connected to line GFN; dummy data bus conductor $DDBUS_k$ is connected to the drain of p-channel transistor $61p$, which has its source biased to $V_{cc}$ and its gate connected to line GFN via inverter 63. Accordingly, when line GFN when is at high logic level, data conductor $DBUS_k$ is biased to ground, and dummy data conductor $DDBUS_k$ is biased to $V_{cc}$; conversely, when line GFN is low, transistors $61n$, $61p$ are both off and do not affect the level of data bus conductors $DDBUS_k$ and dummy data bus conductors $DDBUS_k$, respectively, as is case during normal operation. Line GFN is preferably driven high during write operations (where a separate internal input data bus is used) and during such times as memory 1 is deselected, so that a complementary relationship between each data conductor DBUS and its dummy data bus conductor DDBUS is maintained at all times.

Memory 1 further includes self-biasing circuits 54T, 54C, each connected to data conductor $DBUS_k$ and dummy data conductor $DDBUS_k$, respectively, to maintain these lines from floating during equilibration and precharge. A single self-biasing circuits 54T, 54C may be implemented for each data conductor $DBUS_k$ and dummy data conductor $DDBUS_k$ in memory 1, or alternatively multiple self-biasing circuits 54T, 54C may be used for each data conductor $DBUS_k$ and dummy data conductor $DDBUS_k$, depending upon the drive required to maintain the precharged state thereof. As is well known, noise can capacitively couple to floating nodes in integrated circuits, such that the potential of such nodes can rise or fall to any potential, especially during long equilibration periods such as can occur if the addresses received by memory 1 are unstable. As will be apparent hereinbelow, floating of data conductors DBUS to a voltage significantly different from the preferred mid-level voltage can push out the access time of the memory if the next data state to be driven is the opposite from that to which one or more of data conductors DBUS floated.

Self-biasing circuit 54T includes p-channel transistors $64p$ and 66 which have their source/drain paths connected in series between $V_{cc}$ and data bus conductor $DDBUS_k$, and n-channel transistors $64n$ and 68 which have their source/drain paths connected in series between data bus conductor $DDBUS_k$ and ground. The gates of transistors $64p$ and $64n$ are both connected to data bus conductor $DDBUS_k$ to maintain its precharged state as described hereinbelow.

The gate of p-channel transistor 66 is connected to line GEQC, which is a precharge signal active at a low logic level, and the gate of n-channel transistor 68 is connected to line GEQT, which is a precharge signal active at a high logic level. Lines GEQT and GEQC (which are the logical complements of one another), are generated by timing and control circuitry 29 as high and low logic level pulses, respectively, which control the initiation and duration of the precharge of data conductors DBUS. In this embodiment of the invention, lines GEQT, GEQC are derived by timing and control circuitry 29 from the pulse on line ATD generated by ATD circuit 25 responsive to detection of a transition at one or more of address terminals $A_0$ through $A_n$, and communicated along control bus CBUS. Derivation of the precharge signals from address transition detection enables precharging of data conductors DBUS at the appropriate early portion of the cycle, since a new memory cycle in an SRAM such as memory 1 begins with receipt of a new address. Such precharge at the beginning of the cycle, rather than at the end, is of course preferred for SRAMs since the duration of the cycle is indeterminate.

Self-biasing circuit 54C is similarly constructed, with p-channel transistors $65p$, 67 having their source/drain paths connected in series between dummy data bus conductor DDBUS$_k$ and V$_{cc}$, and with n-channel transistors 65n, 69 having their source/drain paths connected in series between dummy data bus conductor DDBUS$_k$ and ground. The gates of transistors 65p, 65n are connected to dummy data bus conductor DDBUS$_k$, and the gates of transistors 67, 69 are connected to precharge lines GEQC, GEQT, respectively.

In operation, self-biasing circuits 54T, 54C are enabled only during the precharge and equilibration operation, when line GEQT is high and line GEQC is low. When enabled, the voltage at data bus conductor DBUS$_k$ (for the case of self-biasing circuit 54T) will determine the state of transistors 65p or 65n. As noted hereinabove and as will be described hereinbelow, data conductor DBUS$_k$ is not actively driven during precharge. Accordingly, if noise couples to data conductor DBUS$_k$ which causes its voltage to rise, transistor 64n will tend to turn on harder, and discharge data conductor DBUS$_k$ until such time as its voltage turns off transistor 64n (or turns it on to a lesser degree than transistor 64p is turned on). Self-biasing circuit 54C operates in the same manner relative to dummy data conductor DDBUS$_k$. Accordingly, self-biasing circuits 54T, 54C keep data conductors DBUS and dummy data conductors DDBUS from floating during precharge, particularly during long precharge and equilibration operations.

The terminal end of data conductor DBUS$_k$ is received by input/output circuitry 20, specifically at the gates of p-channel pull-up transistor 72p and n-channel pull-down transistor 72n in output stage 80. The source/drain paths of transistors 72p, 72n are connected in series, between V$_{cc}$ and ground, with the source/drain paths of transistors 74, 76. The gate of p-channel transistor 74 is connected to line GEQT, and the gate of n-channel transistor 76 is connected to line GEQC, and their drains are connected together. Latch 78, consisting of cross-coupled inverters, has its input connected to the drains of transistors 74, 76; the output of latch 78, node Q$_k$, is forwarded to the output buffers of memory 1 for presentation thereat.

In operation, during precharge and equilibration (line GEQT high and line GEQC low), the state of data conductor DBUS is isolated from affecting node Q$_k$, as transistors 74, 76 are both turned off. During normal operation, transistors 74, 76 are on and output stage 80 operates as a conventional CMOS inverter. Since transistors 74, 76 in output stage 80 are turned off during the precharge and equilibration period, output stage 80 is disabled from responding to the state of data conductor DBUS$_k$. This allows data conductor DBUS$_k$ to be safely precharged to a voltage near the trip point of output stage 80, without resulting in oscillations of the output circuitry as would otherwise occur if output stage 80 remained enabled during precharge.

It is preferred that self-biasing circuit 54T (and self-biasing circuit 54C, for symmetry) be constructed in such a manner that its bias point is near the trip point of output stage 80 driven by data conductor DBUS. As such, the push-pull construction of self-biasing circuit 54T matches the construction of output stage 80. In order to minimize the current drawn through self-biasing circuits 54T, 54C, it is preferred that the sizes of the transistors therein be scaled from those in output stage 80. For example, the channel widths of the transistors in self-biasing circuits 54T, 54C are preferably on the order of one-fourth of the transistors in output stage 80; the channel lengths in self-biasing circuits 54T, 54C are preferably longer, for example by a factor of three, than in output stage 80. The bias current provided by self-biasing circuits 54T, 54C is therefore quite small, but is sufficient to keep data conductors DBUS from floating to a voltage significantly different from its precharged level.

It is contemplated that self-biasing circuits 54T, 54C may also be beneficial when implemented in other data bus arrangements, for example a differential data bus where each bit of data is communicated by a differential (or complementary) signal carried on a pair of data bus lines. The advantages of maintaining the precharged level on differential conductors as described hereinabove may thus be obtained in these arrangements, as well.

Equilibration transistor 70 has its source/drain path connected between data conductor DBUS$_k$ and dummy data conductor DDBUS$_k$, and has its gate connected to line GEQT (transistor 70 being n-channel). Transistor 70 is therefore turned on during precharge (line GEQT high), and will effect the precharging of data conductor DBUS by way of charge sharing, as will be described hereinbelow. Alternatively, a p-channel transistor with its gate controlled by line GEQC may be used in place of, or in parallel with, n-channel equilibration transistor 70. In addition, it may be preferable in some cases to provide multiple transistors 70 for each data conductor DBUS$_k$ and dummy data conductor DDBUS$_k$, for example one transistor 70 at each end thereof; of course, depending upon the size of transistor 70, a single placement may be sufficient.

As illustrated in FIG. 5, dummy data conductors DDBUS are terminated by terminations 37. Terminations 37 provide a load to dummy data conductor DDBUS which matches that presented by output stage 80 to data conductors DBUS. In the example of FIG. 3, termination 37$_k$ includes p-channel transistor 81p which has its source and drain connected together to V$_{cc}$, and n-channel transistor 81n which has its source and drain connected together to ground; the gates of transistors 81p and 81n are connected to dummy data conductor DDBUS$_k$. Termination 37$_k$ thus presents the equivalent capacitance (i.e., the gate capacitance of a CMOS inverter) to dummy data conductor DDBUS$_k$ that output stage 80 presents to data conductor DBUS$_k$.

Figure 4:
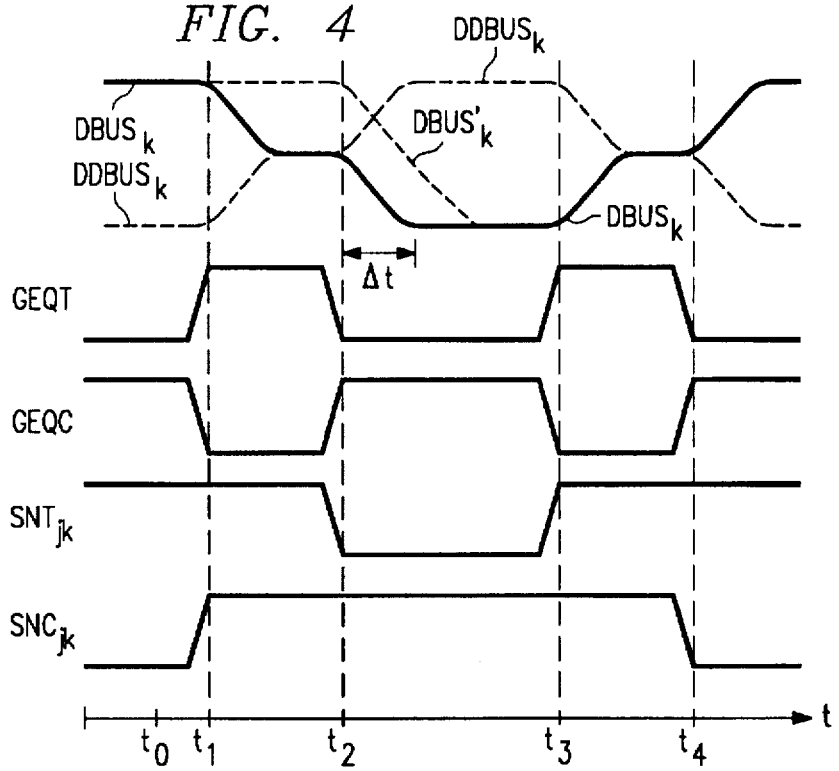
FIG. 4 is a timing diagram illustrating the operation of the preferred embodiment of the invention.

Referring now to FIG. 4, the operation of the preferred embodiment of the invention will now be described in detail. At time t$_0$ in this example, data conductor DBUS$_k$ is at a high level and dummy data conductor DDBUS$_k$ is at a low level, due to the complementary operation of tristate driver 15$_{jk}$ as a result of node SNT$_{jk}$ at a high level and node SNC$_{jk}$ at a low level. Also at time t$_0$, since the access of the selected memory cell has been active for some time, precharge lines GEQT and GEQC are low and high, respectively.

The precharge and equilibration operation begins at time t$_1$, which is a specified time after the beginning of the next cycle; as noted hereinabove, a new cycle in memory 1 can be initiated by a transition at one or more of address terminals A$_0$ through A$_n$, at the end of a write operation, or upon receipt of a chip enable signal. Responsive to detection of this transition, at time t$_1$, line GEQT is driven to a high level, line GEQC is driven low; also at this time, sense/write circuit 13$_{jk}$ is turned off by way of lines SAEQ__ and SCLK, so that node SNC$_{jk}$ goes to a logic high level. With both nodes SNT$_{jk}$ and SNC$_{jk}$ high, tristate driver 15$_{jk}$ enters a high impedance state.

Prior to time t$_1$, data conductor DBUS$_k$ and dummy data conductor DDBUS$_k$ (since all other sense/write circuits 13 and tristate drivers 15 are in a high impedance state, having not been selected in this cycle) are at high and low logic levels, respectively. As line GEQT goes to a high level at time t$_1$, transistor 70 turns on, connecting data conductor DBUS$_k$ to dummy data conductor DDBUS$_k$. Since tristate driver 15$_{jk}$ enters its high impedance state at this time and no longer actively drives either data conductor DBUS$_k$ and dummy data conductor DDBUS$_k$, transistor 70 initiates charge sharing between data conductor DBUS$_k$ and dummy data conductor DDBUS$_k$. Data conductor DBUS$_k$ and dummy data conductor DDBUS$_k$ thus discharge and charge, respectively, to a common potential near the mid-level between high and low logic levels. Precharge of data conductor DBUS$_k$ is then complete.

Also during this time, output stage 80 is disabled from responding to the precharged state of data conductor DBUS$_k$, as transistors 74, 76 therein are held off by lines GEQC, GEQT, respectively.

For purposes of clarity, the duration of precharge and equilibration between times $t_1$ and $t_2$, as illustrated in FIG. 4, is relatively short. As such, the voltage of data conductor DBUS$_k$ and dummy data conductor DDBUS$_k$ is not likely to significantly drift from its precharged level as a result of capacitively coupled noise. However, in memory 1 as in many SRAM and DRAM memory devices, the precharge and equilibration period can be quite long, for example on the order of microseconds. In an SRAM device where precharge and equilibration are triggered by address transition detection, such as memory 1, a long precharge and equilibration period can result from unstable, or high frequency, address signals applied to memory 1. In clocked circuits, such as FIFOs, DRAMs, embedded memories in microprocessors, microprocessors themselves, and the like, a low frequency or long duty cycle clock signal will cause a long precharge and equilibration period.

Self-biasing circuits 54T, 54C prevent data conductors DBUS and dummy data conductors DDBUS from drifting far from their precharged voltage, even during long precharge and equilibration periods. As noted hereinabove relative to FIG. 3, if data conductor DBUS$_k$ receives noise which causes it to drift upward, transistor 64$n$ (and transistor 65$n$, due to transistor 70 being on) will turn on harder, discharging data conductor DBUS$_k$ (and dummy data conductor DDBUS$_k$) to ground; transistors 64$p$, 65$p$ operate similarly if data conductor DBUS$_k$ and dummy data conductor DDBUS$_k$ drift low. As a result, the precharged level of data bus conductors DBUS in data bus 22 of memory 1 is maintained, and is maintained near the trip point of output stage 80, in the preferred embodiment of the invention, even over long precharge and equilibration periods.

Referring back to FIG. 4, the next read access operation begins at time $t_2$, with lines GEQT, GEQC returning low and high, respectively. For clarity of explanation, it is presumed that the next access is also from array block 10$_j$; the operation of data conductor DBUS$_k$ will be similar, however, if a different array block 10 were selected. With the end of precharge at time $t_2$, sense/write circuit 13$_{jk}$ is again enabled. In this example, the next data state to be presented is a "0", and accordingly node SNT$_{jk}$ is driven low by sense/write circuit 13$_{jk}$ at the end of the precharge and equilibration period. Self-biasing circuits 54T, 54C are disabled by lines GEQT, GEQC returning low and high, respectively, and therefore data driver 15$_{jk}$ begins driving data conductor DBUS$_k$ low from the precharged level (and also begins driving dummy data conductor DDBUS$_k$ high).

Also at this time, upon the return of lines GEQT, GEQC low and high, respectively, output stage 80 is again enabled to receive the data state on data conductor DBUS$_k$. Since the construction of output stage 80 and self-biasing circuit 54T is similar, except for transistor scaling, the precharged voltage to which data conductor DBUS$_k$ is held is quite close to the trip voltage of output stage 80. Accordingly, input/output circuitry 20 can respond very quickly to the discharging (in this case) of data conductor DBUS$_k$ from its midlevel voltage, in this case immediately after time $t_2$. This provides savings in the access time of memory 1 from that in prior configurations where data conductors in data buses would, in the worst case, have to be switched from rail-to-rail. FIG. 4 illustrates the rail-to-rail discharging of data conductor DBUS$_k$' in such a prior arrangement. Assuming that the new access begins at the same time (i.e., time $t_2$), prior data conductor DBUS$_k$' does not reach the trip point of output stage 80 until well after time $t_2$, due to the R-C load presented thereby to its driver. The access time savings provided by the present invention is illustrated in FIG. 4 by $\Delta t$, which in modern high speed SRAMs can be on the order of 1.5 to 2.0 nsec, and thus on the order of 10% of the overall access time of memory 1.

During the active period between times $t_2$ and $t_3$, dummy data conductor DBUS$_k$ is driven by tristate driver 15$_{jk}$ to the opposite data state (in this case a "1") from that of data conductor DBUS$_k$. Termination 37$_k$ adds a load to dummy data conductor DDBUS$_k$ similar to that of output stage 80, and as such the switching of dummy data conductor DBUS$_k$ matches, in a complementary fashion, the switching of data conductor DBUS$_k$. As a result, the state of dummy data conductor DDBUS$_k$ is complementary to that of data conductor DDBUS$_k$ at all times during the active period, even during the transient switching time. The provision of the matching load by termination 37$_k$ thus allows the next precharge operation to begin at any time, as may occur in circuits such as SRAM memory 1, ensuring that charge sharing will precharge data conductor DBUS$_k$ to the proper midlevel voltage.

The opposite transition of data conductor DBUS$_k$ is illustrated in FIG. 4, beginning with precharge and equilibration at time $t_3$. In this case, as lines GEQT, GEQC are driven high and low, respectively node SNT$_{jk}$ is pulled high to place tristate driver 15$_{jk}$ in its high impedance state, transistor 70 is turned on to equilibrate data conductor DBUS$_k$ and dummy data conductor DDBUS$_k$ which are thus precharged, by way of charge sharing, to a midlevel voltage. Self-biasing circuits 54T, 54C operate as before to maintain this precharged level on data conductor DDBUS$_k$. Beginning at time $t_4$, the next access begins with lines GEQT, GEQC returning low and high, respectively, at which time the new high level data state is presented by node SNC$_{jk}$ driven low by sense/write circuit 13$_{jk}$.

The present invention thus provides the significant advantage of improved access times, by reducing the time required to switch high capacitance internal data buses. The instantaneous dynamic current drawn by memory 1 is also reduced, as the switching voltage of the data conductors in the internal data bus is reduced by approximately one-half. These advantages are achieved by way of charge sharing, thus not requiring generation of a precharge voltage driver and the circuitry necessary to apply the generated precharge voltage; in addition, self-biasing circuits are provided to prevent floating of the data bus to undesired voltages, particularly in long precharge and equilibration periods, as such floating could slow the access time in the next cycle. Furthermore, the precharging of the data bus is facilitated by a tristate data driver which enters the high impedance mode by operation of the sense amplifier, without requiring an additional timing and control signal to be applied thereto.

While the invention has been described herein relative to its preferred embodiment, it is of course contemplated that modifications of, and alternatives to, this embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. In an integrated circuit of the type having a data bus including a data conductor, and having a sense amplifier for presenting a differential signal at first and second sense nodes corresponding to a sensed digital value, wherein said sense amplifier is precharged when disabled so that said first and second sense nodes are both at a precharge voltage, a data driver circuit comprising:

a first pull-up transistor having a conduction path connected in series between a first power supply node and said data conductor, and having a control electrode;

a first pull-down transistor having a conduction path connected in series between a second power supply node and said data conductor, and having a control electrode;

means for connecting said first sense node to the control electrode of said first pull-up transistor in such a manner that said first pull-up transistor is turned off responsive to said first sense node at said precharge voltage;

means for connecting said second sense node to the control electrode of said first pull-down transistor in such a manner that said first pull-down transistor is turned off responsive to said second sense node at said precharge voltage;

a complementary data conductor;

a second pull-up transistor having a conduction path connected in series between said first power supply node and said complementary data conductor, and having a control electrode;

a second pull-down transistor having a conduction path connected in series between said second power supply node and said complementary data conductor, and having a control electrode;

means for connecting said second sense node to the control electrode of said second pull-up transistor in such a manner that said second pull-up transistor is turned off and on when said first pull-down transistor is turned off and on, respectively; and means for connecting said first sense node to the control electrode of said second pull-down transistor in such a manner that said second pull-down transistor is turned off and on when said first pull-up transistor is turned off and on, respectively.

2. An integrated circuit, comprising:

a data bus including a first data conductor;

a first plurality of sense amplifiers for amplifying a differential signal in said integrated circuit and presenting the amplified differential signal at first and second sense nodes;

means for selecting one of said first plurality of sense amplifiers for communication of its amplified differential signal to said first data conductor so that unselected ones of said first plurality of sense amplifiers bias their first and second sense nodes to a precharge voltage; and a first plurality of data drivers, each associated with one of said first plurality of sense amplifiers, each of said first plurality of data drivers comprising:

a first pull-up transistor having a conduction path connected in series between a first power supply node and said first data conductor, and having a control electrode;

a first pull-down transistor having a conduction path connected in series between a second power supply node and said first data conductor, and having a control electrode;

means for connecting the first sense node of the associated one of said first plurality of sense amplifiers to the control electrode of said first pull-up transistor in such a manner that said first pull-up transistor is turned off responsive to said first sense node of the associated one of said first plurality of sense amplifiers at said precharge voltage; and means for connecting the second sense node of the associated one of said first plurality of sense amplifiers to the control electrode of said first pull-down transistor in such a manner that said first pull-down transistor is turned off responsive to said second sense node of the associated one of said first plurality of sense amplifiers at said precharge voltage;

wherein said data bus further comprises a complementary data conductor;

and wherein each of said first plurality of data drivers further comprise:

a second pull-up transistor having a conduction path connected in series between said first power supply node and said complementary data conductor, and having a control electrode;

a second pull-down transistor having a conduction path connected in series between said second power supply node and said complementary data conductor, and having a control electrode;

means for connecting said second sense node of the associated one of said first plurality of sense amplifiers to the control electrode of said second pull-up transistor in such a manner that said second pull-up transistor is turned off and on when said first pull-down transistor is turned off and on, respectively; and means for connecting said first sense node of the associated one of said first plurality of sense amplifiers to the control electrode of said second pull-down transistor in such a manner that said second pull-down transistor is turned off and on when said first pull-up transistor is turned off and on, respectively.

3. The data driver circuit of claim 1, further comprising:

a third pull-up transistor having a conduction path connected between said complementary data conductor and said first power supply node, said third pull-up transistor having a control terminal connected to a deselect signal in a manner that turns on the third pull-up transistor responsive to the deselect signal; and a third pull-down transistor having a conduction path connected between said data conductor and said second power supply node, said third pull-down transistor having a control terminal connected to the deselect signal in a manner that turns on the third pull-down transistor responsive to the deselect signal, the deselect signal indicating that said data driver has been deselected.

4. The data driver circuit of claim 1, further comprising:

a self-biasing circuit coupled to said data conductor, said self-biasing circuit including:

a third pull-up transistor connected between said first power supply node and said data conductor, said third pull-up transistor having a control terminal connected to said data conductor in a manner that raises a voltage level on said data conductor in response to the voltage level being below a threshold voltage; and a third pull-down transistor connected between said second power supply node and said data conductor, said third pull-down transistor having a control terminal connected to said data conductor in a manner that lowers the voltage level on said data conductor in response to the voltage level being above a threshold voltage.

5. An integrated circuit comprising:

an internal data bus including an internal data conductor;

a sense amplifier for presenting a differential signal at first and second sense nodes corresponding to a sensed digital value, wherein said sense amplifier is precharged when disabled so that said first and second sense nodes are both at a precharge voltage, wherein the sense amplifier includes a disable transistor that switches off in response to said precharge voltage being applied to said first and second sense nodes, the disable transistor preventing said sense amplifier from presenting said differential signal when the disable transistor is switched off;

a data driver circuit for driving the internal data conductor, comprising:

a first pull-up transistor having a conduction path connected in series between a first power supply node and said data conductor, and having a control electrode connected to said first sense node in such a manner that said first pull-up transistor is turned off responsive to said first sense node at said precharge voltage; and a first pull-down transistor having a conduction path connected in series between a second power supply node and said data conductor, and having a control electrode connected to said second sense node in such a manner that said first pull-down transistor is turned off responsive to said second sense node at said precharge voltage; and an output stage, connected to said data conductor, and comprising a driver for driving an output node to a logic level corresponding to the voltage on said data conductor.

6. The integrated circuit of claim 5, wherein said first pull-up transistor is of a first conductivity type;

and wherein said first pull-down transistor is of a second conductivity type.

7. The integrated circuit of claim 6, wherein said precharge voltage corresponds to said first power supply node.

8. The integrated circuit of claim 7, wherein said first conductivity type is p-type and said second conductivity type is n-type;

and wherein said first power supply node is positive relative to said second power supply node.

9. The integrated circuit of claim 7, wherein said first sense node is connected to the control electrode of said first pull-up transistor by an even number of inverters connected in series and said second sense node is connected to the control electrode of said first pull-down transistor by an odd number of inverters connected in series.

10. The integrated circuit of claim 5, wherein said integrated circuit includes a memory;

and wherein said sense amplifier is for sensing a stored state of a selected memory cell in said memory.

11. The integrated circuit of claim 5, further comprising:

first connecting means for connecting said control electrode of said first pull-up transistor to said first sense node; and second connecting means for connecting said control electrode of said first pull-down transistor to said second sense node, wherein each of said connecting means presents a load of substantially the same size to said first and second sense nodes.

12. An integrated circuit comprising:

an internal data bus including an internal data conductor;

a sense amplifier for presenting a differential signal at first and second sense nodes corresponding to a sensed digital value, wherein said sense amplifier is precharged when disabled so that said first and second sense nodes are both at a precharge voltage, a data driver circuit for driving the internal data conductor comprising:

a first pull-up transistor having a conduction path connected in series between a first power supply node and said data conductor, and having a control electrode connected to said first sense node in such a manner that said first pull-up transistor is turned off responsive to said first sense node at said precharge voltage; and a first pull-down transistor having a conduction path connected in series between a second power supply node and said data conductor, and having a control electrode connected to said second sense node in such a manner that said first pull-down transistor is turned off responsive to said second sense node at said precharge voltage;

an output stage, connected to said data conductor, and comprising a driver for driving an output node to a logic level corresponding to the voltage on said data conductor; and a self-biasing circuit coupled to said internal data conductor, said self-biasing circuit including:

a second pull-up transistor connected between said first power supply node and said internal data conductor, said second pull-up transistor having a control terminal connected to said internal data conductor in a manner that raises a voltage level on said internal data conductor in response to the voltage level being below a threshold voltage range; and a second pull-down transistor connected between said second power supply node and said internal data conductor, said second pull-down transistor having a control terminal connected to said internal data conductor in a manner that lowers the voltage level on said internal data conductor in response to the voltage level being above the threshold voltage range.

13. The integrated circuit of claim 12 wherein said self-biasing circuit further includes:

a first enable transistor series-connected with said second pull-up transistor between said first power supply node and said internal data conductor, said first enable transistor having a control terminal coupled to an enable signal having a first state when said first and second sense nodes are at the precharge voltage and a second state when said first and second sense nodes are not at the precharge voltage, said first enable transistor being turned on when the enable signal is at the first state; and a second enable transistor series-connected with said second pull-down transistor between said second power supply node and said internal data conductor, said second enable transistor having a control terminal coupled to the enable signal such that said second enable transistor is turned on when the enable signal is at the first state.

14. An integrated circuit comprising:

an internal data bus including an internal data conductor;

a sense amplifier for presenting a differential signal at first and second sense nodes corresponding to a sensed digital value, wherein said sense amplifier is precharged when disabled so that said first and second sense nodes are both at a precharge voltage;

a data driver circuit for driving the internal data conductor, comprising:

a first pull-up transistor having a conduction path connected in series between a first power supply node and said data conductor and having a control electrode connected to said first sense node in such a manner that said first pull-up transistor is turned off responsive to said first sense node at said precharge voltage; and a first pull-down transistor having a conduction path connected in series between a second power supply node and said data conductor, and having a control electrode connected to said second sense node in such a manner that said first pull-down transistor is turned off responsive to said second sense node at said precharge voltage;

an output stage, connected to said data conductor, and comprising a driver for driving an output node to a logic level corresponding to the voltage on said data conductor, wherein said output stage includes:

a disable transistor having a conducting path connected between said internal data conductor and said output node, said disable transistor including a control terminal connected to a precharge signal having a first state when said first and second sense nodes are at the precharge voltage and having a second state when said first and second sense nodes are not at the precharge voltage, said disable transistor turning off to isolate said output node from said internal data conductor in response to the precharge signal being at the first state.

15. An integrated circuit, comprising:

an internal data bus including first and second internal data conductors;

a first plurality of sense amplifiers for amplifying a differential signal in said integrated circuit and presenting the amplified differential signal at first and second sense nodes;

means for selecting one of said first plurality of sense amplifiers for communication of its amplified differential signal to said first data conductor so that unselected ones of said first plurality of sense amplifiers bias their first and second sense nodes to a precharge voltage;

a first plurality of data drivers, each associated with one of said first plurality of sense amplifiers, each of said first plurality of data drivers comprising:

a first pull-up transistor having a conduction path connected in series between a first power supply node and said first internal data conductor, and having a control electrode;

a first pull-down transistor having a conduction path connected in series between a second power supply node and said first internal data conductor, and having a control electrode;

means for connecting the first sense node of the associated one of said first plurality of sense amplifiers to the control electrode of said first pull-up transistor in such a manner that said first pull-up transistor is turned off responsive to said first sense node of the associated one of said first plurality of sense amplifiers at said precharge voltage; and means for connecting the second sense node of the associated one of said first plurality of sense amplifiers to the control electrode of said first pull-down transistor in such a manner that said first pull-down transistor is turned off responsive to said second sense node of the associated one of said first plurality of sense amplifiers at said precharge voltage;

an output stage connected to said first internal data conductor of said data bus, said output stage comprising an output driver for driving a terminal to a logic level responsive to the voltage on said first internal data conductor;

a second plurality of sense amplifiers for amplifying a differential signal in said integrated circuit and presenting the amplified differential signal at first and second sense nodes; and a second plurality of data drivers, each associated with one of said second plurality of sense amplifiers, each of said second plurality of data drivers comprising;

a pull-up transistor having a conduction path connected in series between said first power supply node and said second data conductor and having a control electrode;

a pull-down transistor having a conduction path connected in series between said second power supply node and said second data conductor, and having a control electrode;

means for connecting the first sense node of the associated one of said second plurality of sense amplifiers to the control electrode of said pull-up transistor in such a manner that said pull-up transistor is turned off responsive to said first sense node of the associated one of said second plurality of sense amplifiers at said precharge voltage; and means for connecting the second sense node of the associated one of said second plurality of sense amplifiers to the control electrode of said pull-down transistor in such a manner that said pull-down transistor is turned off responsive to said second sense node of the associated one of said second plurality of sense amplifiers at said precharge voltage;

wherein said selecting means also selects one of said second plurality of sense amplifiers for communication of its amplified differential signal to said second data conductor so that unselected ones of said second plurality of sense amplifiers bias their first and second sense nodes to a precharge voltage.

16. The integrated circuit of claim 15, wherein each of said first pull-up transistors is of a first conductivity type;

and wherein each of said first pull-down transistors is of a second conductivity type.

17. The integrated circuit of claim 16, wherein said precharge voltage corresponds to said first power supply node.

18. The integrated circuit of claim 17, wherein said first conductivity type is p-type and said second conductivity type is n-type;

and wherein said first power supply node is positive relative to said second power supply node.

19. The integrated circuit of claim 17, wherein each of said means for connecting said first sense node to the control terminal of said first pull-up transistor comprises an even number of inverters connected in series;

and wherein each of said means for connecting said second sense node to the control electrode of said first pull-down transistor comprises an odd number of inverters connected in series.

20. The integrated circuit of claim 15, wherein said integrated circuit includes a memory and wherein each of said first plurality of sense amplifiers is for sensing the stored state of a selected memory cell in said memory.

21. The integrated circuit of claim 15, wherein each of said first plurality of data drivers presents a load of substantially the same size to the first and second sense nodes of its associated one of said first plurality of sense amplifiers.

22. An integrated circuit comprising:

a data bus including a data conductor;

a sense amplifier for presenting a differential signal at first and second sense nodes corresponding to a sensed digital value, wherein said sense amplifier is precharged when disabled so that the first and second sense nodes are both at a precharge voltage;

a data driver circuit coupled to the sense amplifier and the data conductor, the data driver circuit isolating the data conductor from the sense amplifier in response to the first and second sense nodes being at the precharge voltage;

a self-biasing circuit coupled to the data conductor, the self-biasing circuit including:

a first pull-up transistor connected between a first power supply node and the data conductor, the first pull-up transistor having a control terminal connected to the data conductor in a manner that raises a voltage level on the data conductor in response to the voltage level being below a threshold voltage range; and a first pull-down transistor connected between a second power supply node and the data conductor, the first pull-down transistor having a control terminal connected to the data conductor in a manner that lowers the voltage level on the internal data conductor in response to the voltage level being above the threshold voltage range; and an output stage, connected to said data conductor, and comprising a driver for driving an output node to a logic level corresponding to the voltage on said data conductor.

23. The integrated circuit of claim 22 wherein said output stage includes:

a disable transistor having a conducting path connected between said internal data conductor and said output node, said disable transistor including a control terminal connected to a precharge signal having a first state when said first and second sense nodes are at the precharge voltage and having a second state when said first and second sense nodes are not at the precharge voltage, said disable transistor turning off to isolate said output node from said internal data conductor in response to the precharge signal being at the first state.

24. The integrated circuit of claim 22, further comprising:

a complementary data conductor connected to the data driver circuit, wherein the data driver circuit isolates the data conductor from the sense amplifier in response to the first and second sense nodes being at the precharge voltage.

25. The data driver circuit of claim 24, further comprising:

a second pull-up transistor having a conduction path connected between the complementary data conductor and the first power supply node, the second pull-up transistor having a control terminal connected to a deselect signal in a manner that, in response to the deselect signal, turns on the second pull-up transistor to connect the complementary data conductor to the first power supply node; and a second pull-down transistor having a conduction path connected between the data conductor and the second power supply node, the second pull-down transistor having a control terminal connected to the deselect signal in a manner that, in response to the deselect signal, turns on the second pull-down transistor to connect the data conductor to the second power supply node.

* * * * *